(12) United States Patent
Li et al.

(10) Patent No.: US 10,735,009 B2
(45) Date of Patent: Aug. 4, 2020

(54) SAMPLING DEVICE

(71) Applicant: CHINA ELECTRONIC TECHNOLOGY CORPORATION, 24TH RESEARCH INSTITUTE, Chongqing (CN)

(72) Inventors: Ting Li, Chongqing (CN); Gang-Yi Hu, Chongqing (CN); Ru-Zhang Li, Chongqing (CN); Jian-An Wang, Chongqing (CN); Yong Zhang, Chongqing (CN); Zheng-Bo Huang, Chongqing (CN); Guang-Bing Chen, Chongqing (CN); Yu-Xin Wang, Chongqing (CN); Dong-Bing Fu, Chongqing (CN); Yan Wang, Chongqing (CN); Jun Yuan, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 52 days.

(21) Appl. No.: 16/475,117

(22) PCT Filed: Jun. 1, 2016

(86) PCT No.: PCT/CN2016/084252
§ 371 (c)(1),
(2) Date: Jun. 30, 2019

(87) PCT Pub. No.: WO2017/201763
PCT Pub. Date: Nov. 30, 2017

(65) Prior Publication Data
US 2019/0341924 A1 Nov. 7, 2019

(30) Foreign Application Priority Data

May 27, 2016 (CN) .......................... 2016 1 0367783

(51) Int. Cl.
*H03M 1/06* (2006.01)

(52) U.S. Cl.
CPC ................................ *H03M 1/0612* (2013.01)

(58) Field of Classification Search
CPC ..... G11C 27/026; G11C 27/024; G11C 27/02; G11C 27/028; H03M 1/1245; H03M 1/0682; H03M 1/46; H03M 1/466
(Continued)

(56) References Cited

U.S. PATENT DOCUMENTS

| 5,208,597 A | 5/1993 | Early et al. |
| 6,515,612 B1 | 2/2003 | Abel |

(Continued)

FOREIGN PATENT DOCUMENTS

| CN | 101621292 A | 1/2010 |
| WO | 2011/036428 A1 | 3/2011 |

*Primary Examiner* — Hai L Nguyen
(74) *Attorney, Agent, or Firm* — Cheng-Ju Chiang

(57) ABSTRACT

A sampling device includes a switch capacitor circuit. First ends of two switches are respectively connected to an input signal. Second end of the first switch is connected to an upper plate of a first capacitor. Second end of the second switch is connected to a lower plate of a second capacitor. A connection node connecting a lower plate of the first capacitor to an upper plate of the second capacitor is connected to a power source. The first ends of a third switch and a fourth switch are respectively connected to an input common-mode voltage. A second end of the third switch is connected to the upper plate of the first capacitor. A second end of the fourth switch is connected to the lower plate of the second capacitor. The connection node is connected to the power source. Thus, an output common-mode voltage of the sampling device is adjustable.

8 Claims, 2 Drawing Sheets

(58) Field of Classification Search
USPC .............................................. 327/91, 93–97
See application file for complete search history.

(56) References Cited

U.S. PATENT DOCUMENTS

| | | | |
|---|---|---|---|
| 7,924,062 B2* | 4/2011 | Chiu ...................... | H03K 5/249 |
| | | | 327/337 |
| 2002/0149508 A1 | 10/2002 | Hamashita | |
| 2012/0133534 A1 | 5/2012 | Oshima | |
| 2012/0280841 A1* | 11/2012 | Wang .................. | H03M 1/1295 |
| | | | 341/110 |

* cited by examiner

SAMPLING DEVICE

CROSS REFERENCE TO RELATED APPLICATIONS

The present application is a 35 U.S.C. § 371 National Phase conversion of International (PCT) Patent Application No. PCT/CN2016/084252, filed on Jun. 1, 2016, which further claims benefit of Chinese Patent Application No. 201610367783.6, filed on May 27, 2016, the disclosure of which is incorporated by reference herein. The PCT International Patent Application was filed and published in Chinese.

TECHNICAL FIELD

The present disclosure relates to the field of signal sampling, and in particular to a sampling device with adjustable output common-mode voltage and capable of eliminating the second-order nonlinearity induced by sampling capacitance voltage coefficients.

BACKGROUND

With the increasing improvement of A/D converter quantization accuracy, the requirements to the linearity thereof are higher and higher. Sampling linearity is a critical factor for A/D converter linearity, and a large amount of applications require lower A/D converter power consumption, and thus, a sampling device with high linearity and low power consumption is required. However, the traditional sampling device usually generates second-order non-linearity during capacitance sampling (that is, the sampled capacitance value includes second-order terms relevant to the input voltage), thus causing low linearity of the sampling device.

SUMMARY

The present disclosure provides a sampling device to solve the problem that the existing sampling device has low linearity.

According to a first aspect of the present disclosure, a sampling device is provided, comprising a switch capacitor circuit, the switch capacitor circuit comprising a first switch, a second switch, a first capacitor and a second capacitor, wherein the first ends of the first switch and the second switch are respectively connected to an input signal, a second end of the first switch is connected to an upper plate of the first capacitor, a second end of the second switch is connected to a lower plate of the second capacitor, a connection node connecting a lower plate of the first capacitor to an upper plate of the second capacitor is connected to a power source, and signal sampling is performed by controlling the closing of the first switch and the second switch.

In an optional implementation, the switch capacitor circuit further comprises a third switch and a fourth switch, wherein the first ends of the third switch and the fourth switch are respectively connected to an input common-mode voltage, a second end of the third switch is connected to the upper plate of the first capacitor, a second end of the fourth switch is connected to the lower plate of the second capacitor, and the connection node is connected to the power source through a sampling switch.

In another optional implementation, the sampling device comprises a plurality of switch capacitor circuit groups; for each switch capacitor circuit group, the switch capacitor circuit group comprises a preset corresponding number of switch capacitor circuits; the connection node of each switch capacitor circuit in the switch capacitor circuit group is connected to a non-power source connection end of a corresponding sampling switch; a power source connection end of the corresponding switch capacitor circuit group is connected to a corresponding power source; and a short-circuit switch is connected between the non-power source connection ends of the sampling switches respectively.

In another optional implementation, at least two of the corresponding power sources connected to the sampling switches respectively are different.

In another optional implementation, the sampling device comprises two switch capacitor circuit groups; a first switch capacitor circuit group comprises the first to the m-th switch capacitor circuit; a second switch capacitor circuit group comprises the (m+1)th to the N-th switch capacitor circuit; in each switch capacitor circuit of the first switch capacitor circuit group; the connection node thereof is connected to a power source $V_{dd}$ through a sampling switch $S_1$; in each switch capacitor circuit of the second switch capacitor circuit group; the connection node thereof is connected to a power source $V_{ss}$ through a sampling switch $S_{1'}$; and a short-circuit switch $S_2$ is provided between the non-power source connection ends of the sampling switch $S_1$ and the sampling switch $S_{1'}$.

In another optional implementation, the power source $V_{dd}$ is different from the power source $V_{ss}$.

In another optional implementation, the sampling device enters a sampling phase to perform charge sampling by controlling the first switches and the second switches of corresponding switch capacitor circuits in the first switch capacitor circuit group and the second switch capacitor circuit group and the sampling switch $S_1$ and the sampling switch $S_{1'}$ to close.

In another optional implementation, the sampling device generates an output voltage and enters a comparison phase by controlling the first switches and the second switches of corresponding switch capacitor circuits in the first switch capacitor circuit group and the second switch capacitor circuit group and the sampling switch $S_1$ and the sampling switch $S_{1'}$ to open and controlling the third switches and the fourth switches of corresponding switch capacitor circuit in the first switch capacitor circuit group and the second switch capacitor circuit group and the short-circuit switch $S_2$ to close.

In another optional implementation, the total charge collected by the sampling device after entering the sampling phase is $Q_s = 2mC_{s0}(V_{in}-V_{dd})+2(N-m)C_{s0}(V_{in}-V_{ss})$, where $C_{s0}$ represents a reference value of the first capacitor and the second capacitor and $V_{in}$ represents the input voltage.

In another optional implementation, the total charge stored by the sampling device after entering the comparison phase is $Q_c = 2NC_{s0}(V_{CMI}-V_O)$, where $C_{s0}$ represents a reference capacitance value of the first capacitor and the second capacitor, $V_{CMI}$ represents the input common-mode voltage and $V_O$ represents the output voltage; and according to the law of conservation of charge, it is derived that $$V_O = -v_{in} + \left[\frac{m}{N}(V_{dd} - V_{ss}) + V_{ss}\right],$$

where $v_{in}$ represents an alternating component of the input voltage $V_{in}$, an output common-mode voltage of the sampling device is $$V_{CMO\_T} = \frac{m}{N}(V_{dd} - V_{ss}) + V_{ss},$$

and the output common-mode voltage is adjusted by changing the value of m.

The beneficial effects of the present disclosure are as follows.

1. By means of providing a capacitor respectively on two paths formed by the input voltage, the input switch and the power source and making the polarities of the capacitors provided on the two paths inverse, the present disclosure can make the collected charge value merely relevant to the first-order term of the input voltage and irrelevant to the second-order term of the input voltage, and thus the second-order non-linearity generated by the traditional sampling device during capacitance sampling can be eliminated and the linearity of the sampling device can be improved.

2. By means of providing a capacitor respectively on two paths formed by the input common-mode voltage, the input switch, the sampling switch and the power source and making the polarities of the capacitors provided on the two paths inverse, the present disclosure can make the stored charge value merely relevant to the first-order term of the output voltage and irrelevant to the second-order term of the output voltage, and thus the second-order non-linearity relevant to the output and generated by the traditional sampling device when entering the comparison phase can be eliminated and the linearity of the sampling device can be improved.

3. In the present disclosure, a plurality of switch capacitor circuit groups are designed, each switch capacitor circuit group includes a preset corresponding number of switch capacitor circuits, and each switch capacitor circuit is connected to a corresponding power source, thus an output common-mode voltage of the sampling device is adjustable. Compared to the fact that the traditional sampling device needs to design an output common-mode voltage generation circuit, in the sampling device proposed in the present disclosure, the switch capacitor circuit group thereof has a function of generating an output common-mode voltage, and thus there is no need to design an output common-mode voltage generation circuit. Secondly, the traditional sampling device needing to design an output common-mode voltage generation circuit causes the power consumption of the circuit to increase, however, the sampling device proposed in the present disclosure need not an output common-mode voltage generation circuit, which greatly reduces the layout area and power consumption of the sampling circuit. In addition, the output common-mode voltage of the traditional sampling device is non-adjustable, however, the sampling device proposed in the present disclosure can achieve the purpose of adjusting the output common-mode voltage by adjusting the value of m, and the adjustable range of the output common-mode voltage is from $V_{ss}$ to $V_{dd}$, achieving the entire power source domain range with stronger circuit universality.

DETAILED DESCRIPTION

In order to make a person skilled in the art better understand the technical solution in the embodiments of the present disclosure and make the above objects, features and advantages of the embodiments of the present disclosure more clear and understandable, the technical solution in the embodiments of the present disclosure will be described in further detail with reference to the accompanying drawings.

In the description of the present disclosure, unless stated and defined otherwise, it should be noted that the term "connection" should be understood broadly, for example, it can be a mechanical connection or an electrical connection and may also be the internal communication of two elements, may also be a direct connection, and may also be an indirect connection through an intermediate medium, and those skilled in the art can understand the particular meaning of the above term according to the particular situation.

Figure 1:
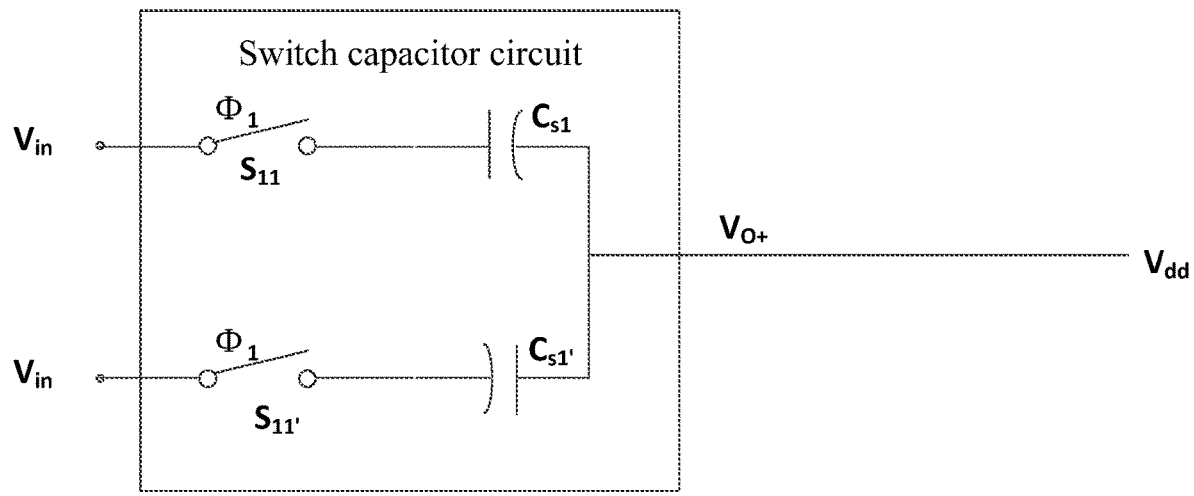
FIG. 1 is a circuit diagram of an embodiment of a switch capacitor circuit in a sampling device according to the present disclosure.

FIG. 1 is a circuit diagram of an embodiment of a switch capacitor circuit in a sampling device according to the present disclosure. The sampling device may comprise a switch capacitor circuit, the switch capacitor circuit comprising a first switch $S_{11}$, a second switch $S_{11'}$, a first capacitor $C_{S1}$ and a fourth capacitor $C_{S1'}$, wherein the first ends of the first switch $S_{11}$ and the second switch $S_{11'}$ may be both connected to an input voltage $V_{in}$, a second end of the first switch $S_{11}$ is connected to an upper plate of the first capacitor $C_{S1}$, a second end of the second switch $S_{11'}$ is connected to a lower plate of the second capacitor $C_{S1'}$, a connection node connecting a lower plate of the first capacitor $C_{S1}$ to an upper plate of the second capacitor $C_{S1'}$ are connected to a power source $V_{dd}$, and signal sampling is performed by controlling the closing of the first switch $S_{11}$ and the second switch $S_{11'}$.

In this embodiment, the closing and opening of the first switch $S_{11}$ and the second switch $S_{11'}$ can be controlled by means of a clock signal $\Phi_1$. For example, when the clock signal $\Phi_1$ has a high level, the first switch $S_{11}$ and the second switch $S_{11'}$ can be closed, and when the clock signal $\Phi_1$ has a low level, the first switch $S_{11}$ and the second switch $S_{11'}$ can be opened. When the first switch $S_{11}$ and the second switch $S_{11'}$ are closed, the input voltage $V_{in}$ can be sampled, at this moment, the voltage $V_{O+}$ of the connection node connecting the lower plate of the first capacitor $C_{S1}$ to the upper plate of the second capacitor $C_{S1'}$ is equal to the power source voltage $V_{dd}$.

In the switch capacitor circuit, $$V_{Cs1} = V_{in} - V_{dd}$$

$$V_{Cs1'} = V_{dd} - V_{in} \qquad (1)$$

where $V_{Cs1}$ represents the voltage of the first capacitor $C_{S1}$ and $V_{Cs1'}$ represents the voltage of the second capacitor $C_{S1'}$.

In order to research the effect of the capacitance non-linearity, the capacitance value of the capacitor $C_s$ can be represented as:

$$C_s = C_{s0}(1 + \alpha_1 V + \alpha_2 V^2 + \ldots) \approx C_{s0}(1 + \alpha_1 V) \qquad (2),$$

where $\alpha_1$ is the first-order voltage coefficient of the capacitor $C_s$, $\alpha_2$ is the second-order voltage coefficient of the capacitor $C_s$, $C_{s0}$ represents the reference value of the first capacitor and the second capacitor, and since the high-order coefficient affects the non-linearity of the capacitor very little, merely the effect of the first-order voltage coefficient to the non-linearity of the capacitor is taken into account. Thus, the capacitance value $C_{S1}$ of the first capacitor and the capacitance value $C_{S1'}$ of the second capacitor can be expressed as:

$$C_{s1} = C_{s0}(1 + \alpha_1 V_{cs1})$$

$$C_{s1'} = C_{s0}(1 + \alpha_1 V_{cs1'}) \qquad (3)$$

The charges $Q(V_{Cs1})$ and $Q(V_{Cs1'})$ collected respectively on the first capacitor $C_{s1}$ and the second capacitor $C_{s1'}$ can be obtained according to equations (1) and (3):

$$Q(V_{Cs1}) = \int_0^{V_{Cs1}} C_{s1} dV = C_{s0}\left(V_{Cs1} + \frac{\alpha_1}{2} V_{Cs1}^2\right) \quad (4)$$

$$Q(V_{Cs1'}) = \int_0^{V_{Cs1'}} C_{s1'} dV = C_{s0}\left(V_{Cs1'} + \frac{\alpha_1}{2} V_{Cs1'}^2\right).$$

By then, the charge $Q_1$ collected on the switch capacitor circuit can be expressed as:

$$\begin{aligned}Q_1 &= Q(V_{Cs1}) - Q(V_{Cs1'}) \\ &= C_{s0}\left(V_{Cs1} + \frac{\alpha_1}{2} V_{Cs1}^2\right) - C_{s0}\left(V_{Cs1'} + \frac{\alpha_1}{2} V_{Cs1'}^2\right) \\ &= 2C_{s0}(V_{in} - V_{dd}).\end{aligned} \quad (5)$$

It can be seen according to equation (5) that the charge $Q_1$ collected on the switch capacitor switch does not include the second-order term relevant to the input voltage, and thus the sampling device can be avoided from generating second-order non-linearity during capacitance sampling, then the linearity of the sampling device can be improved.

It can be seen from the above embodiment that by means of providing a capacitor respectively on two paths formed by the input voltage, the input switch and the power source and making the polarities of the capacitors provided on the two paths inverse, the present disclosure can make the collected capacitance charge value merely relevant to the first-order term of the input voltage and irrelevant to the second-order term of the input voltage, and thus the second-order non-linearity generated by the traditional sampling device during capacitance sampling can be eliminated and the linearity of the sampling device can be improved.

Figure 2:
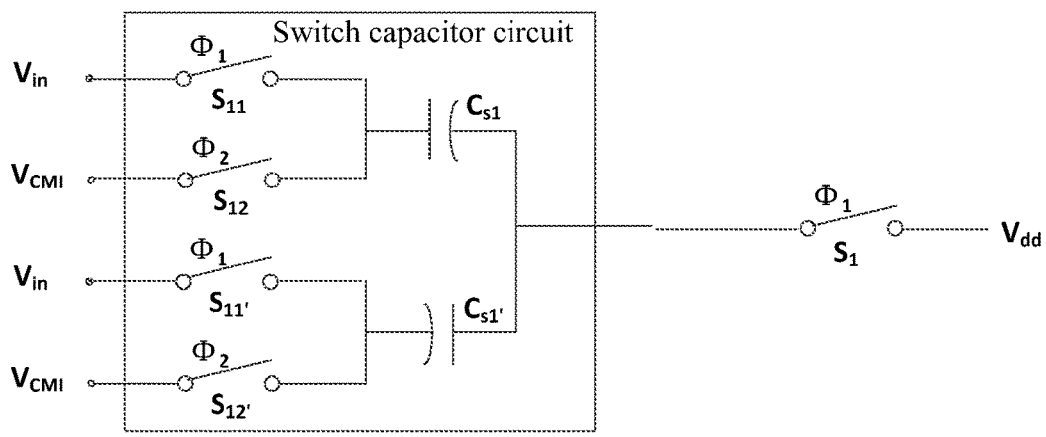
FIG. 2 is another circuit diagram of an embodiment of a switch capacitor circuit in a sampling device according to the present disclosure.

FIG. 2 is a circuit diagram of another embodiment of a switch capacitor circuit in a sampling device according to the present disclosure. The difference between the switch capacitor circuits shown in FIG. 2 and FIG. 1 lies in that it may further comprise a third switch $S_{12}$ and a fourth switch $S_{12'}$, wherein the first ends of the third switch $S_{12}$ and the fourth switch $S_{12'}$ are connected to an input common-mode voltage $V_{CMI}$, a second end of the third switch $S_{12}$ is connected to the upper plate of the first capacitor $C_{S1}$, a second end of the fourth switch $S_{12'}$ is connected to the lower plate of the second capacitor $C_{S1'}$, and a connection node connecting the lower plate of the first capacitor $C_{S1}$ to the upper plate of the second capacitor $C_{S1'}$ is connected to the power source $V_{dd}$ through the sampling switch $S_1$.

In this embodiment, the closing or opening of the first switch $S_{11}$, the second switch $S_{11'}$ and the sampling switch $S_1$ can be controlled by means of a clock signal $\Phi_1$. For example, when the clock signal $\Phi_1$ has a high level, the first switch $S_{11}$, the second switch $S_{11'}$ and the sampling switch $S_1$ can be closed, and when the clock signal $\Phi_1$ has a low level, the first switch $S_{11}$, the second switch $S_{11'}$ and the sampling switch $S_1$ can be opened. When the first switch $S_{11}$, the second switch $S_{11'}$ and the sampling switch $S_1$ are closed, the switch capacitor circuit enters a sampling phase. The closing and opening of the third switch $S_{12}$ and the fourth switch $S_{12'}$ can be controlled by means of a clock signal $\Phi_2$. For example, when the clock signal $\Phi_2$ has a high level, the third switch $S_{12}$ and the fourth switch $S_{12'}$ can be closed, and when the clock signal $\Phi_2$ has a low level, the third switch $S_{12}$ and the fourth switch $S_{12'}$ can be opened. When the third switch $S_{12}$ and the fourth switch $S_{12'}$ are closed and the first switch $S_{11}$, the second switch $S_{11'}$ and the sampling switch $S_1$ are closed, the switch capacitor circuit enters a comparison phase.

When the switch capacitor circuit shown in FIG. 2 performs voltage sampling on the input voltage, the first switch $S_{11}$, the second switch $S_{11'}$ and the sampling switch $S_1$ can be first controlled to be closed, and at this moment, the switch capacitor circuit enters the sampling phase, which can collect the charge $Q_1$ in equation (5) in the same manner as the embodiment shown in FIG. 1, then the third switch $S_{12}$ and the fourth switch $S_{12'}$ are controlled to be closed and the first switch $S_{11}$, the second switch $S_{11'}$ and the sampling switch $S_1$ are opened, and at this moment, the switch capacitor circuit enters the comparison phase, which can calculate the stored charge $Q_1'$ in the following manner.

When the third switch $S_{12}$ and the fourth switch $S_{12'}$ are closed and the sampling switch $S_1$ is closed. In the switch capacitor circuit, $$V'_{Cs1} = V_{CMI} - V_{O+}$$

$$V'_{Cs1'} = V_{O+} - V_{CMI} \quad (6)$$

where $C_{Cs1}$ represents the voltage of the first capacitor $C_{S1}$, $V_{Cs1'}$ represents the voltage of the second capacitor $C_{S1'}$, $V_{O+}$ represents the voltage across the connection node connecting the lower plate of the first capacitor $C_{S1}$ to the upper plate of the second capacitor $C_{S1'}$, that is, the output voltage.

The capacitance value $C_{S1}$ of the first capacitor and the capacitance value $C_{S1'}$ of the second capacitor can be expressed as:

$$C'_{s1} = C_{s0}(1 + \alpha_1 V'_{cs1})$$

$$C'_{s1'} = C_{s0}(1 + \alpha_1 V'_{cs1'}) \quad (7).$$

The charges $Q(V'_{Cs1})$ and $Q(V'_{Cs1'})$ stored respectively on the first capacitor $C_{S1}$ and the second capacitor $C_{S1'}$ can be obtained according to equations (6) and (7):

$$Q(V'_{Cs1}) = \int_0^{V'_{Cs1}} C'_{s1} dV = C_{s0}\left(V'_{Cs1} + \frac{\alpha_1}{2} V'^2_{Cs1}\right) \quad (8)$$

$$Q(V'_{Cs1'}) = \int_0^{V'_{Cs1'}} C'_{s1'} dV = C_{s0}\left(V'_{Cs1'} + \frac{\alpha_1}{2} V'^2_{Cs1'}\right).$$

By then, the charge $Q'_1$ stored on the switch capacitor circuit may be expressed as:

$$\begin{aligned}Q'_1 &= Q(V'_{Cs1}) - Q(V'_{Cs1'}) \\ &= C_{s0}\left(V'_{Cs1} + \frac{\alpha_1}{2} V'^2_{Cs1}\right) - C_{s0}\left(V'_{Cs1'} + \frac{\alpha_1}{2} V'^2_{Cs1'}\right) \\ &= 2C_{s0}(V_{CMI} - V_{O+}).\end{aligned} \quad (9)$$

During the voltage sampling process of the traditional sampling device, not only the charge collected after entering the sampling phase includes second-order terms relevant to the input voltage, but also the charge stored after entering the comparison phase includes second-order terms relevant to the output voltage. It can be seen according to equation (5) that the charge $Q_1$ collected on the switch capacitor switch after entering the sampling phase does not include the second-order term relevant to the input voltage, and thus the sampling device can be avoided from generating second-order non-linearity during sampling after entering the sampling phase. In addition, it can be seen according to equation (9) that the charge $Q'_1$ stored on the switch capacitor switch after entering the comparison phase does not include the second-order term relevant to the output voltage, and thus the sampling device can be avoided from generating second-order non-linearity relevant to the output voltage after entering the comparison phase.

According to the law of conservation of charge, equations (5) and (9) are equal to each other, that is:

$$2C_{s0}(V_{in}-V_{dd})=2C_{s0}(V_{CMI}-V_{O+}) \qquad (10).$$

It can be obtained that:

$$V_{O+}=V_{CMI}-V_{in}+V_{dd} \qquad (11).$$

By then, the sampling device achieves the voltage sampling of the input signal.

It can be seen from the above embodiment that by means of providing a capacitor respectively on two paths formed by the input voltage, the input switch and the power source and making the polarities of the capacitors provided on the two paths inverse, the present disclosure can make the collected capacitance charge value merely relevant to the first-order term of the input voltage and irrelevant to the second-order term of the input voltage, and thus the second-order non-linearity generated by the traditional sampling device during voltage sampling after entering the sampling phase can be eliminated and the linearity of the sampling device can be improved. By means of providing a capacitor respectively on two paths formed by the input common-mode voltage, the input switch, the sampling switch and the power source and making the polarities of the capacitors provided on the two paths inverse, the present disclosure can make the stored capacitance charge value merely relevant to the first-order term of the output voltage and irrelevant to the second-order term of the output voltage, and thus the second-order non-linearity relevant to the output voltage and generated by the traditional sampling device when entering the comparison phase can be eliminated and the linearity of the sampling device can be improved.

In the embodiment shown in FIG. 2, although the sampling device can eliminate the second-order non-linearity generated during the voltage sampling process, the sampled voltage $V_{O+}$ is still closely relevant to $V_{dd}$, in which $V_{dd}$ can be viewed as the common-mode voltage of the traditional sampling device. Since $V_{dd}$ is non-adjustable, a corresponding common-mode voltage generation circuit needs to be designed respectively in order to meet different output common-mode voltage requirements. For this end, the present disclosure proposes a sampling device with adjustable output common-mode voltage, and this sampling device may comprise a plurality of switch capacitor circuit groups, for each switch capacitor circuit group, the switch capacitor circuit group comprises a preset corresponding number of switch capacitor circuits shown in FIG. 2, and for each switch capacitor circuit in the switch capacitor circuit group, a connection node connecting a lower plate of a first capacitor to an upper plate of a second capacitor is connected to a corresponding power source through a corresponding sampling switch; and a short-circuit switch is connected between the non-power source connection ends of the sampling switches respectively. There is at least one switch capacitor circuit in the above switch capacitor circuit groups, the preset number of the switch capacitor circuits included therein is greater than 1, and at least two power sources connected to the sampling switches are different.

Figure 3:
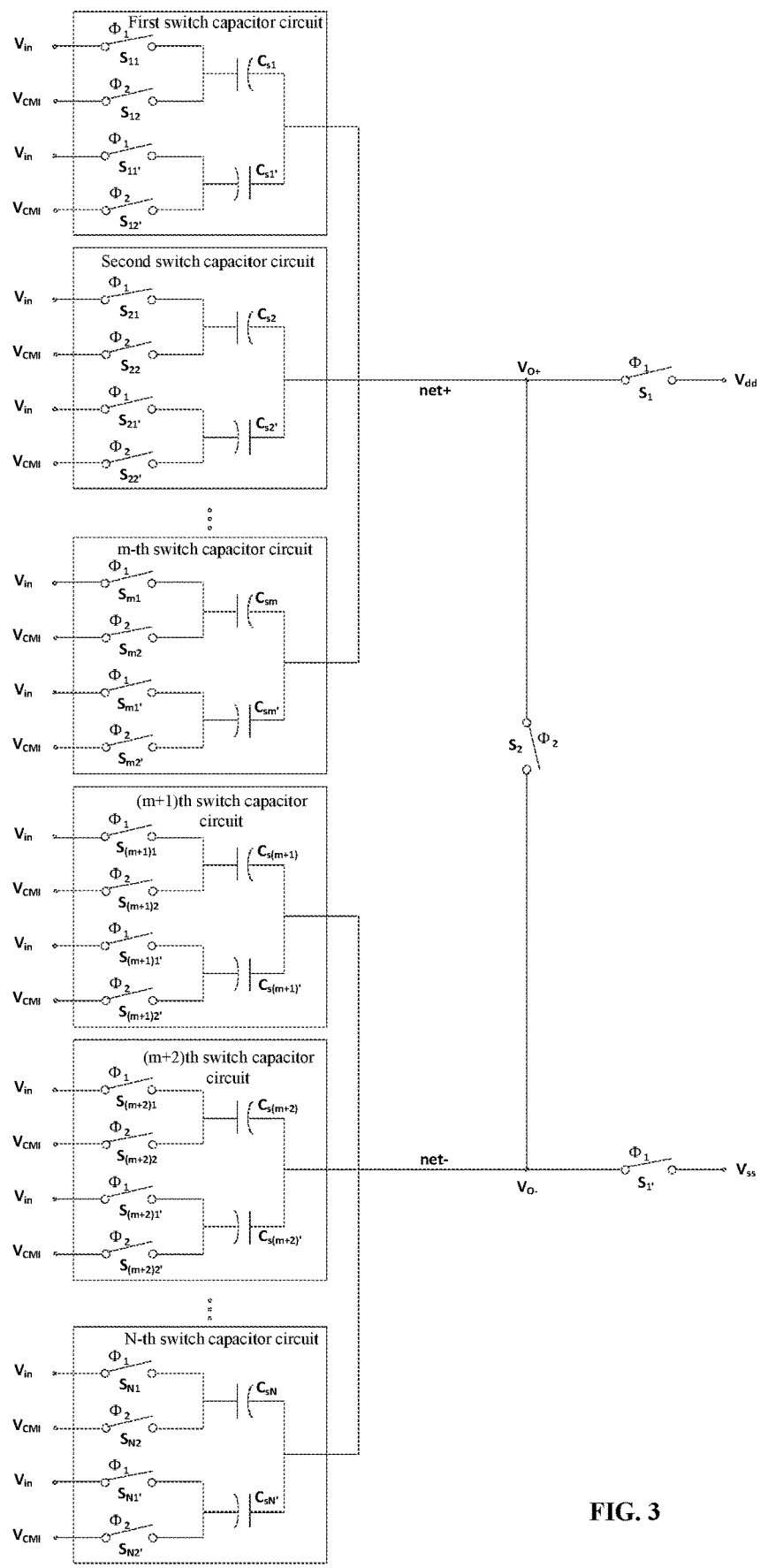
FIG. 3 is a circuit diagram of an embodiment of a sampling device according to the present disclosure.

Hereinafter, the sampling device including two switch capacitor circuits is taken as an example, referring to FIG. 3. In this embodiment, the first switch capacitor group includes the first to the m-th switch capacitor circuit shown in FIG. 2, the second switch capacitor circuit group includes the (m+1) to the N-th switch capacitor circuit shown in FIG. 2, the first switch capacitor circuit group is provided with a sampling switch $S_1$ and a power source $V_{dd}$ correspondingly, the second switch capacitor circuit group is provided with a sampling switch $S_{1'}$ and a power source $V_{ss}$ respectively, and in each switch capacitor circuit of the first switch capacitor circuit group, the connection node connecting the lower plate of the first capacitor to the lower plate of the second capacitor is connected to the power source $V_{dd}$ through the sampling switch $S_1$, and in each switch capacitor circuit of the second switch capacitor circuit group, the connection node connecting the lower plate of the first capacitor to the upper plate of the second capacitor is connected to the power source $V_{ss}$ through the sampling switch $S_{1'}$, a short-circuit switch $S_2$ is provided between the non-power source connection ends of the sampling switches $S_1$ and $S_{1'}$, and the power source $V_{dd}$ and the power source $V_{ss}$ are different.

In this embodiment, in the first switch capacitor circuit group, taking the first switch capacitor circuit as an example, this switch capacitor circuit may include input switches $S_{11}$, $S_{12}$, $S_{11'}$, $S_{12'}$ and sampling capacitors $C_{S1}$ and $C_{S1'}$; the left end of the input switch $S_{11}$ is connected to an input signal $V_{in}$ and the right end is connected to the upper plate of the sampling capacitor $C_{S1}$; the left end of the input switch $S_{12}$ is connected to an input common-mode voltage $V_{CM}$ and the right end is connected to the upper plate of the sampling capacitor $C_{S1}$; the left end of the input switch $S_{11'}$ is connected to the input signal $V_{in}$ and the right end is connected to the lower plate of the sampling capacitor $C_{S1'}$; the left end of the input switch $S_{12'}$ is connected to the input common-mode voltage $V_{CM}$ and the right end is connected to the lower plate of the sampling capacitor $C_{S1'}$; and the lower plate of the capacitor $C_{S1}$ is connected to net+ and the upper plate of the capacitor $C_{S1'}$ is connected to net+. Taking the m-th switch capacitor circuit as an example, this switch capacitor circuit may include input switches $S_{m1}$, $S_{m2}$, $S_{m1'}$, $S_{m2'}$ and sampling capacitors $C_{Sm}$ and $C_{Sm'}$; the left end of the input switch $S_{m1}$ is connected to the input signal $V_{in}$ and the right end is connected to the upper plate of the sampling capacitor $C_{Sm}$; the left end of the input switch $S_{m2}$ is connected to the input common-mode voltage $V_{CM}$ and the right end is connected to the upper plate of the sampling capacitor $C_{Sm}$; the left end of the input switch $S_{m1'}$ is connected to the input signal $V_{in}$ and the right end is connected to the lower plate of the sampling capacitor $C_{Sm'}$; the left end of the input switch $S_{m2'}$ is connected to the input common-mode voltage $V_{CM}$ and the right end is connected to the lower plate of the sampling capacitor $C_{Sm'}$; and the lower plate of the capacitor $C_{Sm}$ is connected to net+ and the upper plate of the capacitor $C_{Sm'}$ is connected to net+.

In the second switch capacitor circuit group, taking the (m+1)th switch capacitor circuit as an example, this (m+1)th switch capacitor circuit may include input switches $S_{(m+1)1}$, $S_{(m+1)2}$, $S_{(m+1)1'}$, $S_{(m+1)2'}$ and sampling capacitors $C_{(m+1)2}$ and $C_{(m+1)2'}$; the left end of the input switch $S_{(m+1)1}$ is connected to the input signal $V_{in}$ and the right end is connected to the upper plate of the sampling capacitor $C_{(m+1)}$; the left end of the input switch $C_{(m+1)2}$ is connected to the input common-mode voltage $V_{CM}$ and the right end is connected to the upper plate of the sampling capacitor $C_{S(m+1)}$; the left end of the input switch $S_{(m+1)1'}$ is connected to the input signal $V_{in}$ and the right end is connected to the lower plate of the sampling capacitor $C_{S(m+1)}$; the left end of the input switch $S_{(m+1)2'}$ is connected to the input common-mode voltage $V_{CM}$ and the right end is connected to the lower plate of the sampling capacitor $C_{S(m+1)'}$; and the lower plate of the capacitor $C_{S(m+1)}$ is connected to net– and the upper plate of the capacitor $C_{S(m+1)'}$ is connected to net–. Taking the N-th switch capacitor circuit as an example, this N-th switch capacitor circuit may include input switches $S_{N1}$, $S_{N2}$, $S_{N1'}$, $S_{N2'}$ and sampling capacitors $C_{SV}$ and $C_{SV'}$; the left end of the input switch $S_{N1}$ is connected to the input signal $V_{in}$ and the right end is connected to the upper plate of the sampling capacitor $C_{SN}$; the left end of the input switch $S_{N2}$ is connected to the input common-mode voltage $V_{CM}$ and the right end is connected to the upper plate of the sampling capacitor $C_{SN}$; the left end of the input switch $S_{N1'}$ is connected to the input signal $V_{in}$ and the right end is connected to the lower plate of the sampling capacitor $C_{SN'}$; the left end of the input switch $S_{N2'}$ is connected to the input common-mode voltage $V_{CM}$ and the right end is connected to the lower plate of the sampling capacitor $C_{SN'}$; and the lower plate of the capacitor $C_{SN}$ is connected to net– and the upper plate of the capacitor $C_{SN'}$ is connected to net–.

When the clock signal $\Phi_1$ has a high level, the sampling device enters the sampling phase, and the switches $S_{11}$, $S_{11'}$, $S_{21}$, $S_{21'}$, ..., $S_{N1}$, $S_{N1'}$, $S_1$ and $S_{1'}$ controlled by the clock signal $\Phi_1$ are closed, and at this moment $V_{O+}$ is equal to $V_{dd}$ and $V_{O-}$ is equal to $V_{ss}$.

In the first switch capacitor circuit, $$V_{Cs1}=V_{in}-V_{dd}$$

$$V_{Cs1'}=V_{dd}-V_{in} \qquad (12).$$

The sampling capacitance value is $$C_{s1}=C_{s0}(1+\alpha_1 V_{cs1})$$

$$C_{s1'}=C_{s0}(1+\alpha_1 V_{cs1'}) \qquad (13).$$

The charge collected on the sampling capacitor is:

$$Q(V_{Cs1}) = \int_0^{V_{Cs1}} C_{s1} dV = C_{s0}\left(V_{Cs1} + \frac{\alpha_1}{2}V_{Cs1}^2\right) \qquad (14)$$

$$Q(V_{Cs1'}) = \int_0^{V_{Cs1'}} C_{s1'} dV = C_{s0}\left(V_{Cs1'} + \frac{\alpha_1}{2}V_{Cs1'}^2\right).$$

Thus, the charge collected by the first switch capacitor circuit is:

$$Q_1 = Q(V_{Cs1}) - Q(V_{Cs1'}) \qquad (15)$$

$$= C_{s0}\left(V_{Cs1} + \frac{\alpha_1}{2}V_{Cs1}^2\right) - C_{s0}\left(V_{Cs1'} + \frac{\alpha_1}{2}V_{Cs1'}^2\right)$$

$$= 2C_{s0}(V_{in} - V_{dd}).$$

Likewise, the charge collected by the i (i=1, 2, ..., m) switch capacitor circuit is:

$$Q_i=2C_{s0}(V_{in}-V_{dd}) \qquad (16).$$

It can seen from equations (14)-(16) that when i=1, 2, ..., m, in the ith switch capacitor circuit, the non-linear charge $$\frac{\alpha_1}{2}C_{s0}V_{Csi}^2 = \frac{\alpha_1}{2}C_{s0}(V_{in} - V_{dd})^2$$

of the sampling capacitor $C_s$ and the non-linear charge $$\frac{\alpha_1}{2}C_{s0}V_{Csi'}^2 = \frac{\alpha_1}{2}C_{s0}(V_{dd} - V_{in})^2$$

of the sampling capacitor $C_{s'}$ cancel each other, thus eliminating the sampling non-linearity.

Likewise, in the (m+1) switch capacitor circuit, $$V_{Cs(m+1)}=V_{in}-V_{ss}$$

$$V_{Cs(m+1)'}=V_{ss}-V_{in} \qquad (17).$$

The sampling capacitance value is $$C_{s(m+1)}=C_{s0}(1+\alpha_1 V_{cs(m+1)})$$

$$C_{s(m+1)'}=C_{s0}(1+\alpha_1 V_{cs(m+1)'}) \qquad (18).$$

The charge collected on the sampling capacitor is:

$$Q(V_{Cs(m+1)}) = \int_0^{V_{Cs(m+1)}} C_{s(m+1)} dV = C_{s0}\left(V_{Cs(m+1)} + \frac{\alpha_1}{2}V_{Cs(m+1)}^2\right) \qquad (19)$$

$$Q(V_{Cs(m+1)'}) = \int_0^{V_{Cs(m+1)'}} C_{s(m+1)'} dV = C_{s0}\left(V_{Cs(m+1)'} + \frac{\alpha_1}{2}V_{Cs(m+1)'}^2\right).$$

Thus, the total charge collected by the (m+1) switch capacitor circuit is:

$$Q_{(m+1)} = Q(V_{Cs(m+1)}) - Q(V_{Cs(m+1)'}) \qquad (20)$$

$$= C_{s0}\left(V_{Cs(m+1)} + \frac{\alpha_1}{2}V_{Cs(m+1)}^2\right) -$$

$$C_{s0}\left(V_{Cs(m+1)'} + \frac{\alpha_1}{2}V_{Cs(m+1)'}^2\right)$$

$$= 2C_{s0}(V_{in} - V_{ss}).$$

Likewise, the charge collected by the i (i=m+1, 2, ..., N) switch capacitor circuit is:

$$Q_i=2C_{s0}(V_{in}-V_{ss}) \qquad (21).$$

It can seen from equations (19)-(21) that when i=m+1, 2, ..., N, in the ith switch capacitor circuit, the non-linear charge $$\frac{\alpha 1}{2}C_{s0}V_{Csi}^2 = \frac{\alpha_1}{2}C_{s0}(V_{in} - V_{ss})^2$$

of the sampling capacitor $C_s$ and the non-linear charge $$\frac{\alpha_1}{2}C_{s0}V_{Csi'}^2 = \frac{\alpha_1}{2}C_{s0}(V_{ss} - V_{in})^2$$

of the sampling capacitor $C_{s1'}$ cancel each other, thus eliminating the sampling non-linearity.

The total charge of the sampling phase is:

$$Q_s = \sum_{i=1}^{m} Q_i + \sum_{i=m+1}^{N} Q_i \qquad (22)$$
$$= mQ_1 + (N-m)Q_{(m+1)}$$
$$= 2mC_{s0}(V_{in} - V_{dd}) + 2(N-m)C_{s0}(V_{in} - V_{ss}).$$

It can be seen from the above equation that the collected total charge $Q_s$ merely contain first-order terms relevant to the input signal $V_{in}$ and does not contain second-order terms relevant to the input signal $V_{in}$, and thus no second-order non-linearity is generated during the sampling process.

When the clock signal $\Phi_2$ has a high level and the clock signal $\Phi_1$ has a low level, the sampling device enters the comparison phase, the switches $S_{12}, S_{12'}, S_{22}, S_{22'}, \ldots, S_{N2}, S_{N2'}, S_2$ controlled by the clock signal $\Phi_2$ are closed, and the switches $S_{11}, S_{11'}, S_{21}, S_{21'}, \ldots, S_{N1}, S_{N1'}, S_1, S_{1'}$ controlled by the clock signal $\Phi_1$ are opened, at this moment $V_{O+} = V_{O-} = V_{OO}$.

In the first switch capacitor circuit, $$V'_{Cs1} = V_{CMI} - V_{O+}$$

$$V'_{Cs1'} = V_{O+} - V_{CMI} \qquad (23).$$

The sampling capacitance value is $$C'_{s1} = C_{s0}(1 + \alpha_1 V'_{cs1})$$

$$C'_{s1'} = C_{s0}(1 + \alpha_1 V'_{cs1'}) \qquad (24).$$

The charge on the sampling capacitor is:

$$Q(V'_{Cs1}) = \int_0^{V'_{Cs1}} C'_{s1} dV = C_{s0}\left(V'_{Cs1} + \frac{\alpha_1}{2} V'^2_{Cs1}\right) \qquad (25)$$

$$Q(V'_{Cs1'}) = \int_0^{V'_{Cs1'}} C'_{s1'} dV = C_{s0}\left(V'_{Cs1'} + \frac{\alpha_1}{2} V'^2_{Cs1'}\right).$$

Thus, the total charge on the first switch capacitor circuit is:

$$Q_1 = Q(V'_{Cs1}) - Q(V'_{Cs1'}) \qquad (26)$$
$$= C_{s0}\left(V'_{Cs1} + \frac{\alpha_1}{2} V'^2_{Cs1}\right) - C_{s0}\left(V'_{Cs1'} + \frac{\alpha_1}{2} V'^2_{Cs1'}\right)$$
$$= 2C_{s0}(V_{CMI} - V_{O+}).$$

Likewise, in the (m+1) switch capacitor, $$V'_{Cs(m+1)} = V_{CMI} - V_{O-}$$

$$V'_{Cs(m+1)'} = V_{O-} - V_{CMI} \qquad (27).$$

The sampling capacitance value is $$C'_{s(m+1)} = C_{s0}(1 + \alpha_1 V'_{cs(m+1)})$$

$$C'_{s(m+1)'} = C_{s0}(1 + \alpha_1 V'_{cs(m+1)'}) \qquad (28).$$

The charge collected on the sampling capacitor is:

$$Q(V'_{Cs(m+1)}) = \int_0^{V'_{Cs(m+1)}} C'_{s(m+1)} dV = C_{s0}\left(V'_{Cs(m+1)} + \frac{\alpha_1}{2} V'^2_{Cs(m+1)}\right) \qquad (29)$$

$$Q(V'_{Cs(m+1)'}) = \int_0^{V'_{Cs(m+1)'}} C'_{s(m+1)'} dV = C_{s0}\left(V'_{Cs(m+1)'} + \frac{\alpha_1}{2} V'^2_{Cs(m+1)'}\right).$$

Thus, the total charge collected by the (m+1) switch capacitor circuit is:

$$Q'_{(m+1)} = Q(V'_{Cs(m+1)}) - Q(V'_{Cs(m+1)'}) \qquad (30)$$
$$= C_{s0}\left(V'_{Cs(m+1)} + \frac{\alpha_1}{2} V'^2_{Cs(m+1)}\right) -$$
$$C_{s0}\left(V'_{Cs(m+1)'} + \frac{\alpha_1}{2} V'^2_{Cs(m+1)'}\right)$$
$$= 2C_{s0}(V_{CMI} - V_{O-}).$$

The total charge of the comparison phase is:

$$Q_c = \sum_{i=1}^{m} Q'_i + \sum_{i=m+1}^{N} Q'_i \qquad (31)$$
$$= mQ_1 + (N-m)Q_{(m+1)}$$
$$= 2mC_{s0}(V_{CMI} - V_{O+}) + 2(N-m)C_{s0}(V_{CMI} - V_{O-})$$
$$= 2NC_{s0}(V_{CMI} - V_{OO}).$$

According to the law of conservation of charge $$Q_s = Q_c \qquad (32).$$

The input signal can be expressed as:

$$V_{in} = v_{in} + V_{CMI} \qquad (33).$$

$v_{in}$ is an alternating component of $V_{in}$, $V_{CMI}$ is the input common-mode voltage, and it can be obtained from (22) and (31)-(33) that $$V_O = -v_{in} + \left[\frac{m}{N}(V_{dd} - V_{ss}) + V_{ss}\right]. \qquad (34)$$

It can be seen that a direct component of the output signal, that is the output common-mode voltage is $$V_{CMO\_T} = \frac{m}{N}(V_{dd} - V_{ss}) + V_{ss}. \qquad (35)$$

It can be seen from equation (35) that when m=0, the output common-mode voltage is $V_{ss}$, and when m=N, the output common-mode voltage is $V_{dd}$, and thus it can be seen that the adjustable range of the output common-mode voltage reaches the entire power source domain, and a flexible output common-mode voltage can be obtained by changing the value of m.

It can be seen from the above embodiment that, in the present disclosure, a plurality of switch capacitor circuit groups are designed, each switch capacitor circuit group includes a preset corresponding number of switch capacitor circuits, and each switch capacitor circuit is connected to a corresponding power source, thus an output common-mode voltage of the sampling device is adjustable. Compared to the fact that the traditional sampling device needs to design an output common-mode voltage generation circuit, in the sampling device proposed in the present disclosure, the switch capacitor circuit group thereof has a function of generating an output common-mode voltage, and thus there is no need to design an output common-mode voltage generation circuit. Secondly, the traditional sampling device needing to design an output common-mode voltage generation circuit causes the power consumption of the circuit to increase; however, the sampling device proposed in the present disclosure need not an output common-mode voltage generation circuit, which greatly reduces the layout area and power consumption of the sampling circuit. In addition, the output common-mode voltage of the traditional sampling device is non-adjustable; however, the sampling device proposed in the present disclosure can achieve the purpose of adjusting the output common-mode voltage by adjusting the value of m, and the adjustable range of the output common-mode voltage is from $V_{ss}$ to $V_{dd}$, achieving the entire power source domain range with stronger circuit universality.

After considering the description and practicing the present disclosure disclosed herein, other implementations of the present disclosure may easily occur to those skilled in the art. The present application is intended to cover any modifications, uses or adaptive changes of the present disclosure, and these modifications, uses or adaptive changes follow the general principles of the present disclosure and include common knowledge or customary technical means in the technical field which is not disclosed in the present disclosure. The description and embodiments shall be deemed merely illustrative, and the real scope and spirit of the present disclosure are set forth in the following claims.

It shall be understood that the present disclosure is not limited to the precise structure described above and illustrated in the drawings and can be modified and varied without departing the scope thereof. The scope of the present disclosure is merely limited by the appended claims.

What is claimed is:

1. A sampling device, comprising a switch capacitor circuit, the switch capacitor circuit comprising a first switch, a second switch, a first capacitor and a second capacitor, wherein the first ends of the first switch and the second switch are respectively connected to an input signal, a second end of the first switch is connected to an upper plate of the first capacitor, a second end of the second switch is connected to a lower plate of the second capacitor, a connection node connecting a lower plate of the first capacitor to an upper plate of the second capacitor is connected to a power source, and signal sampling is performed by controlling the closing of the first switch and the second switch, the switch capacitor circuit further comprises a third switch and a fourth switch, wherein the first ends of the third switch and the fourth switch are respectively connected to an input common-mode voltage, a second end of the third switch is connected to the upper plate of the first capacitor, a second end of the fourth switch is connected to the lower plate of the second capacitor, and the connection node is connected to the power source through a sampling switch, the sampling device comprises a plurality of switch capacitor circuit groups; for each switch capacitor circuit group, the switch capacitor circuit group comprises a preset corresponding number of switch capacitor circuits; the connection node of each switch capacitor circuit in the switch capacitor circuit group is connected to a non-power source connection end of a corresponding sampling switch; a power source connection end of the corresponding switch capacitor circuit group is connected to a corresponding power source; and a short-circuit switch is connected between the non-power source connection ends of the sampling switches respectively.

2. The device according to claim 1, wherein at least two of the corresponding power sources connected to the sampling switches respectively are different.

3. The device according to claim 1, wherein the sampling device comprises two switch capacitor circuit groups; a first switch capacitor circuit group comprises the first to the m-th switch capacitor circuit; a second switch capacitor circuit group comprises the (m+1)th to the N-th switch capacitor circuit; in each switch capacitor circuit of the first switch capacitor circuit group, the connection node thereof is connected to a power source $V_{dd}$ through a sampling switch $S_1$; in each switch capacitor circuit of the second switch capacitor circuit group, the connection node thereof is connected to a power source $V_{ss}$ through a sampling switch $S_{1'}$; and a short-circuit switch $S_2$ is provided between the non-power source connection ends of the sampling switch $S_1$ and the sampling switch $S_{1'}$.

4. The device according to claim 3, wherein the power source $V_{dd}$ and the power source $V_{ss}$ are different.

5. The device according to claim 4, wherein the sampling device enters a sampling phase to perform charge sampling by controlling the first switches and the second switches of corresponding switch capacitor circuits in the first switch capacitor circuit group and the second switch capacitor circuit group and the sampling switch $S_1$ and the sampling switch $S_{1'}$ to close.

6. The device according to claim 5, wherein the sampling device generates an output voltage and enters a comparison phase by controlling the first switches and the second switches of corresponding switch capacitor circuits in the first switch capacitor circuit group and the second switch capacitor circuit group and the sampling switch $S_1$ and the sampling switch $S_{1'}$ to open and controlling the third switches and the fourth switches of corresponding switch capacitor circuit in the first switch capacitor circuit group and the second switch capacitor circuit group and the short-circuit switch $S_2$ to close.

7. The device according to claim 5, wherein the total charge collected by the sampling device after entering the sampling phase is $Q_s=2mC_{s0}(V_{in}-V_{dd})+2(N-m)C_{s0}(V_{in}-V_{ss})$, where $C_{s0}$ represents a reference value of the first capacitor and the second capacitor and $V_{in}$ represents the input voltage.

8. The device according to claim 7, wherein the total charge stored by the sampling device after entering the comparison phase is $Q_c=2NC_{s0}(V_{CMI}-V_O)$, where $C_{s0}$ represents a reference capacitance value of the first capacitor and the second capacitor, $V_{CMI}$ represents the input common-mode voltage and $V_O$ represents the output voltage; and according to the law of conservation of charge, it is derived that $$V_O = -v_{in} + \left[\frac{m}{N}(V_{dd} - V_{ss}) + V_{ss}\right],$$

where $v_{in}$ represents an alternating component of the input voltage $V_{in}$, an output common-mode voltage of the sampling device is $$V_{CMO\_T} = \frac{m}{N}(V_{dd} - V_{ss}) + V_{ss},$$

and the output common-mode voltage is adjusted by changing the value of m.

* * * * *